(12) United States Patent
Strohmaier et al.

(10) Patent No.: US 11,824,324 B2
(45) Date of Patent: Nov. 21, 2023

(54) DIODE LASER ARRANGEMENT AND METHOD FOR PRODUCING A DIODE LASER ARRANGEMENT

(71) Applicant: TRUMPF Photonics, Inc., Cranbury, NJ (US)

(72) Inventors: Stephan Strohmaier, Berlin (DE); Arne-Heike Meissner-Schenk, Berlin (DE); Gerald Urban, Neuzelle (DE); Gerd Hansen, Berlin (DE); Christian Carstens, Stahnsdorf (DE)

(73) Assignee: TRUMPF Photonics, Inc., Cranbury, NJ (US)

( * ) Notice: Subject to any disclaimer, the term of this patent is extended or adjusted under 35 U.S.C. 154(b) by 457 days.

(21) Appl. No.: 17/254,619

(22) PCT Filed: Jun. 18, 2019

(86) PCT No.: PCT/EP2019/066007
§ 371 (c)(1),
(2) Date: Dec. 21, 2020

(87) PCT Pub. No.: WO2019/243326
PCT Pub. Date: Dec. 26, 2019

(65) Prior Publication Data
US 2021/0119412 A1 Apr. 22, 2021

(30) Foreign Application Priority Data
Jun. 21, 2018 (DE) .......................... 102018210141.8

(51) Int. Cl.
*H01S 5/024* (2006.01)

(52) U.S. Cl.
CPC ...... *H01S 5/02423* (2013.01); *H01S 5/02476* (2013.01)

(58) Field of Classification Search
CPC .................................................... H01S 5/02423
See application file for complete search history.

(56) References Cited

U.S. PATENT DOCUMENTS 6,647,035 B1 * 11/2003 Freitas .................. H01S 5/4025
372/36
7,154,926 B2 12/2006 Kouta et al.
(Continued)

FOREIGN PATENT DOCUMENTS

DE 19605302 A1 8/1997
EP 1452614 A1 9/2004
(Continued)

*Primary Examiner* — Tuan N Nguyen
(74) *Attorney, Agent, or Firm* — Laurence A. Greenberg; Werner H. Stemer; Ralph E. Locher (57) ABSTRACT

A diode laser arrangement has a diode laser device and at least one cooling device. The at least one cooling device is arranged on the diode laser device. The at least one cooling device is configured to cool the diode laser device. The at least one cooling device has a contact body and at least one heat conducting insert. The contact body contains a first material or consisting of a first material, and the at least one heat conducting insert has a second material, which is different from the first material, or consisting of a second material, which is different from the first material, and the contact body is arranged on the diode laser device. The at least one heat conducting insert is embedded in the contact body.

14 Claims, 2 Drawing Sheets

(56) References Cited

U.S. PATENT DOCUMENTS

| | | |
|---|---|---|
| 2002/0136250 A1 | 9/2002 | Roellig et al. |
| 2005/0051891 A1 | 3/2005 | Yoshida et al. |
| 2008/0008216 A1 | 1/2008 | Miller et al. |
| 2009/0185593 A1* | 7/2009 | Stephens, IV ........ H01S 5/4025 438/122 |
| 2010/0177796 A1 | 7/2010 | Miller |
| 2011/0138627 A1 | 6/2011 | Morigami et al. |
| 2013/0058367 A1* | 3/2013 | Grove ................. H01S 5/02469 438/26 |
| 2013/0279530 A1* | 10/2013 | Kageyama .............. H01S 5/023 372/35 |
| 2014/0182824 A1 | 7/2014 | Hirotsuru et al. |

FOREIGN PATENT DOCUMENTS

| | | | |
|---|---|---|---|
| JP | 2003309316 A | 10/2003 |
| TW | 200515666 A | 5/2005 |
| WO | 2009036919 A2 | 3/2009 |
| WO | 2014063911 A1 | 5/2014 |

\* cited by examiner

DIODE LASER ARRANGEMENT AND METHOD FOR PRODUCING A DIODE LASER ARRANGEMENT

BACKGROUND OF THE INVENTION

Field of the Invention

The invention relates to a diode laser arrangement and to a method for producing a diode laser arrangement.

During the operation of a diode laser device with one or more emitters in particular in the high-power range, for example a high-power diode laser bar, heat losses are generated which must be dissipated in order to attain a high output power with simultaneously long service life and high beam quality of the diode laser device. Typically, a diode laser arrangement with such a diode laser device therefore has a cooling device which is thermally coupled to the diode laser device and which is configured for dissipating the heat losses. A maximum achievable output power of the diode laser device is thus limited in particular by the effectiveness of the cooling device, which is in particular dependent on the thermal conductivity of materials of the cooling device for the transfer of heat losses. Highly thermally conductive materials suitable for this purpose, for example composite materials with a diamond component, are known. However, these materials are difficult to process mechanically, such that a support surface of the cooling device on which the diode laser device can be arranged can be produced only with insufficient quality and high outlay. For the connection of the diode laser device to the cooling device, intermediate layers or separate components are usually provided, which are attached by means of soldered connections. However, this increases the thermal resistance and reduces the thermal conductivity. Furthermore, additional joints are created which in particular reduce the long-term stability of the diode laser arrangement.

SUMMARY OF THE INVENTION

The invention is based on the object of creating a diode laser arrangement and a method for producing a diode laser arrangement, wherein the disadvantages mentioned do not arise.

The object is achieved through the creation of the subjects of the independent claims. Advantageous refinements become apparent from the dependent claims.

The object is achieved in particular through the creation of a diode laser arrangement which has a diode laser device and at least one cooling device. The diode laser device is configured to emit a laser beam, which may also be composed of multiple partial laser beams. Here, the at least one cooling device is arranged on the diode laser device. Here, the at least one cooling device is configured for cooling the diode laser device. Here, the at least one cooling device has a contact body and at least one heat-conducting insert. Here, the contact body has a first material or is composed of a first material. Here, the at least one heat-conducting insert has a second material which differs from the first material, or is composed of a second material which differs from the first material. Here, the contact body is arranged on the diode laser device. Here, the at least one heat-conducting insert is embedded in the contact body.

The diode laser arrangement according to the invention has advantages in relation to the prior art. By virtue of the fact that the at least one cooling device has a contact body and at least one heat-conducting insert which is embedded in the contact body, the contact body can be configured, in particular with regard to its material, such that a structure and/or surface which is suitable for assembly of the diode laser device can be produced on a support surface of the contact body in an inexpensive manner and with high quality. Furthermore, a material thickness of the contact body can be adapted to the at least one cooling device in accordance with specific requirements. For example, effective heat transfer can be achieved by means of a relatively small material thickness. In the case of a relatively large material thickness, there is for example resulting space for cooling structures, for example cooling channels. Here, the at least one heat-conducting insert can be configured such that an optimum dissipation of heat from the diode laser device can be realized. An output power of the diode laser device can thus be significantly increased. Furthermore, the beam characteristics of the diode laser device are improved in particular through reduction or even avoidance of a temperature-induced shift of the wavelength during operation. Furthermore, a maximum temperature of the diode laser device during operation can be reduced, which in particular leads to a lengthening of its service life. In particular, safe and reliable operation of the diode laser arrangement with high output power of the diode laser device is made possible. The diode laser device preferably has at least one emitter, in particular single emitter. Such an emitter is preferably formed as an edge emitter. Such an emitter is preferably formed as a high-power emitter. The diode laser device particularly preferably has multiple emitters, wherein the diode laser device is formed in particular as a diode laser bar with multiple emitters, which are preferably arranged in a one-dimensional row (array). Such a diode laser bar is preferably formed as an edge emitter. Such a diode laser bar is particularly preferably formed as a high-power diode laser bar.

In particular, the diode laser device is thermally coupled to the at least one cooling device, such that, in particular during operation of the diode laser arrangement according to the invention, heat can be transferred from the diode laser device to the at least one cooling device. The at least one cooling device is formed in particular as a heat sink.

The contact body has, in particular on the support surface in a section in which the diode laser device is arranged and/or lies on the contact body, a structure and/or a surface which is suitable for particularly effective heat transfer from the diode laser device to the at least one cooling device. In particular, the contact body is of particularly thin-walled form in this section, such that heat can be transferred particularly effectively.

In a preferred embodiment of the diode laser arrangement according to the invention, the at least one cooling device is configured to make electrical contact with the diode laser device. In particular, the diode laser arrangement has two cooling devices of the type discussed, wherein a first of the two cooling devices is electrically connected to a p-side and a second of the two cooling devices is electrically connected to an n-side of the diode laser device.

In a preferred embodiment of the diode laser arrangement according to the invention, in each case exactly one heat-conducting insert is assigned to a cooling device of the type discussed. Said heat-conducting insert is preferably of substantially plate-shaped form, wherein it extends, at least in certain sections, parallel to the support surface of the contact body. In an alternative embodiment of the diode laser arrangement according to the invention, multiple heat-conducting inserts of the type discussed are assigned to a cooling device of the type discussed. Said heat-conducting inserts are preferably of substantially plate-shaped form, wherein they extend, at least in certain sections, in each case parallel to the support surface of the contact body. The multiple heat-conducting inserts may be arranged in each case so as to be spaced apart from one another or so as to lie directly against one another. They may be arranged one above the other or one below the other or adjacent to one another.

The at least one heat-conducting insert is preferably formed so as to be geometrically delimitable in relation to the contact body.

In particular, the at least one heat-conducting insert is arranged in an interior of the contact body. The at least one heat-conducting insert is particularly preferably partially or completely surrounded by the contact body. In particular, the contact body forms, as it were, a shell around the at least one heat-conducting insert. A material thickness of the shell-like contact body is, in one section of the contact body, in particular in a region of the support surface in which the contact body is arranged on the diode laser device, dimensioned such that—in particular prior to assembly of the diode laser device—a suitable structure and/or surface of the support surface can be realized by means of mechanical processing, for example by means of machining with a geometrically defined and/or geometrically undefined cutting edge, wherein this structure and/or surface allows particularly effective heat transfer during operation of the diode laser arrangement according to the invention. A material thickness in the section mentioned refers in particular to a spacing, defined by means of the contact body, between the diode laser device and a heat-conducting insert of the type discussed which is directly adjacent to said diode laser device.

In the section of the contact body in the region of the support surface in which the contact body is arranged on the diode laser device or lies thereon, the material thickness is preferably at least 5 μm and at most 100 μm, in particular at least 10 μm and at most 50 μm. A particularly effective heat transfer via the contact body can be realized by means of such a material thickness.

A material thickness on a side of the contact body which is situated opposite the support surface and on which a separate cooling element is arranged, for example via a connection surface of the contact body, is preferably at least 5 μm and at most 100 μm, in particular at least 10 μm and at most 50 μm. A particularly effective heat transfer via the contact body can be realized by means of such a material thickness.

In a preferred embodiment of the diode laser arrangement, it is provided that cooling structures, for example cooling channels, are formed into the contact body on that side of the contact body which is situated opposite the support surface. In particular, cooling of the diode laser device is realized by conducting a cooling fluid through said cooling structures. By means of the cooling structures, it is preferably possible to dispense with a separate cooling element of the type discussed. In the region of the cooling structures, a material thickness of the contact body is, at least in certain sections, preferably at least 1 mm, preferably at least 3 mm, preferably at least 5 mm.

It is therefore possible for a material thickness of the contact body to be of different sizes on different sides of the contact body. This is the case in particular if cooling structures are formed into the contact body on that side of said contact body which is situated opposite the support surface with the diode laser device.

A contact body of the type discussed with material thicknesses of up to 5 mm or even greater than 5 mm can be realized for example by means of sintering.

In a preferred embodiment of the diode laser arrangement according to the invention, multiple heat-conducting inserts of the type discussed are provided, wherein at least one of the multiple heat-conducting inserts is embedded in the contact body. Said one of the multiple heat-conducting inserts is preferably arranged in an interior of the contact body, wherein said one heat-conducting insert is in particular arranged directly adjacent to the diode laser device in the contact body.

An embodiment of the diode laser arrangement is preferable which is distinguished by the fact that the first material has a first thermal conductivity, wherein the second material has a second thermal conductivity which is greater than the first thermal conductivity. For example, the first thermal conductivity is between 380 W/(m*K) and 400 W/(m*K). Such values are obtained for example in the case of copper or copper alloys. For example, the second thermal conductivity is between 550 W/(m*K) and 800 W/(m*K). Such values are obtained for example in the case of copper-diamond composite material or silver-diamond composite material. In the case of carbon composite material, it is for example possible to realize a thermal conductivity of more than 1000 W/(m*K). For example, with the use of carbon nanotubes, a thermal conductivity in a preferred direction of up to 6000 W/(m*K) is possible. In this way, effective heat transfer by means of the at least one heat-conducting insert is realized.

An embodiment of the diode laser arrangement is preferable which is distinguished by the fact that the first material is copper or a copper alloy. Copper and copper alloys are particularly easy and inexpensive to process mechanically. In particular, it is thereby possible for a structure and/or a surface with an exact geometry to be realized in the region of the support surface on the contact body in which the diode laser device is arranged. The support surface is preferably of planar form at least in said region. The first material may also have some other material which can be easily processed mechanically or in some other way. Overall, the first material ensures inexpensive and precise processing of the contact body.

An embodiment of the diode laser arrangement is preferable which is distinguished by the fact that the second material is selected from a group comprising a copper-diamond composite material, a silver-diamond composite material and a carbon composite material. Such a carbon composite material has, in particular, graphite. For example, such a carbon composite material has a carbon nanotube structure, wherein particularly high thermal conductivity exists in particular along the tube axis. In particular, an anisotropic thermal conductivity of the at least one heat-conducting insert can be realized by means of a carbon composite material of the type discussed, such that a preferred direction for the heat transfer can be defined.

Composite materials of the type discussed have particularly high thermal conductivity. Furthermore, these composite materials have relatively low coefficients of thermal expansion and/or are adaptable with regard to their coefficients of thermal expansion, for example through selection or combination of suitable materials, to a coefficient of thermal expansion of the diode laser device, in particular of one or more emitters of the diode laser device. The second material may in particular also have some other material which has a higher thermal conductivity than the first material.

An embodiment of the diode laser arrangement is preferable which is distinguished by the fact that a coefficient of thermal expansion of the at least one cooling device is coordinated with a coefficient of thermal expansion of the diode laser device such that tension of the diode laser device, in particular of an emitter or of multiple emitters of the diode laser device, is avoided. Such instances of tension may be temperature-induced and introduced into an emitter of the type discussed for example during assembly of the diode laser arrangement, in particular as a result of soldering and subsequent cooling of the diode laser device.

The coefficient of thermal expansion of the at least one cooling device is preferably at least 70% of the coefficient of thermal expansion of the diode laser device and at most 130% of the coefficient of thermal expansion of the diode laser device, in particular at least 90% of the coefficient of thermal expansion of the diode laser device and at most 110% of the coefficient of thermal expansion of the diode laser device. In particular, it is preferably provided that the coefficient of thermal expansion of the at least one cooling device is equal to the coefficient of thermal expansion of the diode laser device. In particular, the coefficient of thermal expansion of the respective cooling device can advantageously be adapted to the diode laser device by means of the at least one heat-conducting insert, for example through selection of suitable materials or material combinations, such that a risk of failure of the diode laser arrangement is significantly reduced.

An embodiment of the diode laser arrangement is preferable which is distinguished by the fact that the at least one heat-conducting insert is produced by means of sintering. In this way, the at least one heat-conducting insert can be advantageously adapted, in particular with regard to its geometrical configuration and its material or its material combination, to the contact body and to the diode laser device.

It is preferably provided that the contact body is produced by means of sintering. In this way, the contact body can be easily adapted, in particular with regard to its geometrical configuration and its material, to the diode laser device. In particular, material thicknesses of up to 5 mm or even greater than 5 mm can be realized by means of sintering. By contrast, such material thicknesses in particular cannot be achieved, or can be achieved only with difficulty, by galvanic application, for example of a copper layer.

An embodiment of the diode laser arrangement is preferable which is distinguished by the fact that the at least one heat-conducting insert is connected to the contact body by means of sintering. In particular, the at least one heat-conducting insert is embedded in the contact body by means of sintering. In this way, the configuration of the at least one cooling device can be easily geometrically and functionally adapted to the diode laser device.

An embodiment of the diode laser arrangement is preferable which is distinguished by the fact that a connection between the contact body and the at least one heat-conducting insert does not have a soldered connection. In particular, said connection has no soft or hard solders. Avoiding such auxiliary materials prevents the heat transfer between the diode laser device and the at least one cooling device from being reduced by such an additional thermal resistance. Furthermore, the long-term stability of the diode laser arrangement can be improved in this way. By reducing or avoiding such joining or machining processes, the costs for the diode laser arrangement can also be lowered.

An embodiment of the diode laser arrangement is preferable which is distinguished by the fact that the contact body has cooling structures for conducting a cooling fluid. By means of the cooling fluid conducted through the cooling structures, it is possible for heat losses of the diode laser device to be transferred, and for said diode laser device to thus be cooled. The cooling fluid is preferably a liquid medium, particularly preferably water or a water-based medium. Alternatively, provision is preferably made for a gaseous cooling fluid, for example air, to be used for cooling.

The cooling structures preferably have one or more cooling channels through which the cooling fluid can be guided. It is possible for such cooling structures, in particular cooling channels, to be at least regionally delimited by the at least one heat-conducting insert, such that direct heat transfer between the cooling fluid and the at least one heat-conducting insert is possible in this region. Cooling structures of the type discussed, for example in the form of grooves, are preferably formed in a region of the contact body which is situated opposite the support surface. The cooling structures are thus arranged in particular on that side of the at least one cooling device or of the at least one heat-conducting insert which is averted from the diode laser device. Groove-like or partially open cooling structures can be sealed off from the surroundings of the diode laser arrangement for example by means of a cover plate.

Preferably, the cooling structures are configured at least in certain sections in the manner of a microchannel cooler or form a microchannel cooler. The diode laser arrangement, in particular the diode laser device, can be cooled particularly effectively and easily by means of the cooling fluid.

An embodiment of the diode laser arrangement is preferable which is distinguished by the fact that the at least one cooling device has a separate cooling element which is thermally coupled to the contact body or to the at least one heat-conducting insert, preferably to the contact body and to the at least one heat-conducting insert. In particular, said cooling element is formed separately insofar as it is formed so as to be geometrically delimitable in relation to the contact body and/or the at least one heat-conducting insert. The separate cooling element preferably lies at least in certain regions against the contact body. Alternatively or in addition, the separate cooling element is preferably arranged on the at least one heat-conducting insert. In particular, the contact body and the at least one heat-conducting insert are then formed as a submount to improve the heat transfer between the diode laser device and the separate cooling element.

In particular, the separate cooling element has cooling structures, for example cooling channels, through which a cooling fluid can be guided in order to transport heat losses away from the diode laser device in order to cool the diode laser device. The separate cooling element is preferably formed at least in certain regions as a microchannel cooler. Particularly effective cooling can be realized by means of the separate cooling element. Furthermore, such a separate cooling element can be configured in a modular manner, such that it can be combined with different diode laser devices, contact bodies and heat-conducting inserts.

An embodiment of the diode laser arrangement is preferable which is distinguished by the fact that the separate cooling element can be cooled by means of a cooling fluid. The cooling fluid is preferably a liquid medium, particularly preferably water or a water-based medium. Alternatively, provision is preferably made for a gaseous cooling fluid, for example air, to be used for cooling. Cooling by means of a cooling fluid can be realized in a particularly effective and inexpensive manner.

An embodiment of the diode laser arrangement is preferable which is distinguished by the fact that the contact body or the at least one heat-conducting insert, preferably the contact body and the at least one heat-conducting insert, are/is connected to the separate cooling element by means of sintering or soldering. Such a connection can be implemented inexpensively by means of such established technologies.

An embodiment of the diode laser arrangement is preferable which is distinguished by the fact that at least one constituent part of the at least one cooling device is produced by means of an additive manufacturing process. In particular, a region of the contact body with cooling structures, preferably on the side situated opposite the support surface, is produced by means of an additive manufacturing process. It is for example possible for the contact body to be produced in a first step by means of sintering and in a second step by means of an additive manufacturing process. Furthermore, it is possible for the contact body to be built up at least in certain sections directly on the at least one heat-conducting insert by means of an additive manufacturing process. Such an additive manufacturing process is in particular a laser-assisted manufacturing process, preferably 3D printing. This may for example be a powder bed process or a free space process.

An embodiment of the diode laser arrangement is preferable which is distinguished by the fact that the diode laser arrangement according to the invention has two cooling devices, wherein a first cooling device of the two cooling devices is arranged on a first side of the diode laser device, and wherein a second cooling device of the two cooling devices is arranged on a second side, situated opposite the first side, of the diode laser device. The first side of the diode laser device may be formed for example as the p-side and the second side of the diode laser device as the n-side, or vice versa. The first and/or the second cooling device is in particular a cooling device according to the embodiments discussed above.

In particular, the first and the second cooling device in each case have a contact body and at least one heat-conducting insert. Preferably, the first and the second cooling device are in each case coordinated with the specific requirements of a p-side and an n-side of the diode laser device, in particular with regard to heat losses to be dissipated, wherein the first and the second cooling device are in particular formed so as to differ from one another. Such double-sided cooling of the diode laser device is particularly effective.

The object is in particular also achieved through the creation of a method for producing a diode laser arrangement. It is particularly preferable that, in the course of the method, a diode laser arrangement according to one of the embodiments described above is produced. In the context of the method, at least one cooling device configured for cooling a diode laser device is arranged on the diode laser device. Here, a contact body, which in particular has a first material, of the at least one cooling device is arranged on the diode laser device. Furthermore, here, at least one heat-conducting insert, which in particular has a second material, of the at least one cooling device is embedded in the contact body. In particular, the advantages that have already been discussed in conjunction with the diode laser arrangement are obtained in the context of the method.

In a preferred embodiment of the method, the at least one heat-conducting insert is produced by sintering. The at least one heat-conducting insert is then preferably embedded in the contact body by means of sintering, in particular in a further sintering process.

Preferably, the at least one heat-conducting insert and/or the contact body are configured, in particular through selection and/or combination of suitable materials and/or through suitable shaping or dimensioning, such that a coefficient of thermal expansion of the respective at least one cooling device is adapted, preferably matched, to a coefficient of thermal expansion of the diode laser device.

The contact body with the at least one heat-conducting insert is then preferably mechanically processed at least in certain regions in order to produce precise dimensions required for assembly of the diode laser device and/or a flat surface and/or a suitable material thickness. This is possible in particular because a sufficiently large layer thickness is present at least in certain regions.

In a preferred embodiment of the method, the contact body with the at least one heat-conducting insert is then connected to a separate cooling element by means of sintering or soldering. Alternatively or in addition, cooling structures, in particular cooling channels, are preferably formed into the contact body for the purposes of conducting a cooling fluid. Said cooling structures are situated in particular on that side of the contact body which is situated opposite the support surface. Said structures are preferably sealed off from surroundings of the diode laser arrangement according to the invention, for example by means of a cover plate.

Alternatively or in addition, the production of the at least one heat-conducting insert and/or of the contact body and/or the embedding of the at least one heat-conducting insert in the contact body is preferably carried out at least in certain sections by means of an additive manufacturing process, preferably a laser-assisted manufacturing process, particularly preferably 3D printing.

The description of the diode laser arrangement, on the one hand, and of the method for producing a diode laser arrangement, on the other hand, are to be understood as complementary to one another. Features of the diode laser arrangement that have been discussed explicitly or implicitly in conjunction with the method are preferably, individually or in combination with one another, features of a preferred embodiment of the diode laser arrangement. Method steps that have been discussed explicitly or implicitly in conjunction with the diode laser arrangement are preferably, individually or in combination with one another, steps of a preferred embodiment of the method. Said method is preferably distinguished by at least one method step which is necessitated by at least one feature of an embodiment of the diode laser arrangement according to the invention or preferred embodiment of the diode laser arrangement. The diode laser arrangement is preferably distinguished by at least one feature which is necessitated by at least one step of an embodiment of the method according to the invention or preferred embodiment of the method.

The invention will be discussed in more detail below on the basis of the drawing.

DETAILED DESCRIPTION OF THE INVENTION

Figure 1:
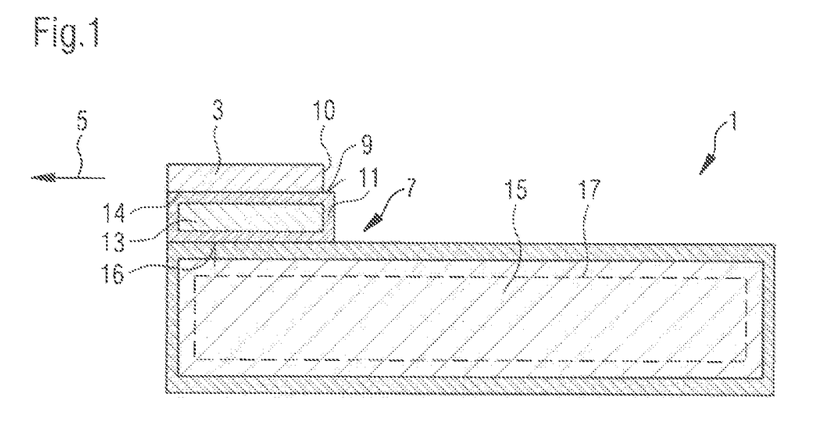
FIG. 1 is a schematic illustration of a first exemplary embodiment of a diode laser arrangement with exactly one cooling device in longitudinal section.

FIG. 1 schematically illustrates a first exemplary embodiment of a diode laser arrangement 1 in longitudinal section. The diode laser arrangement 1 has a diode laser device 3. For example, the diode laser device 3 has a diode laser bar with multiple emitters or is formed as a diode laser bar with multiple emitters. The diode laser device 3 has, in particular, a high-power diode laser bar or is formed as a high-power diode laser bar. In particular, one emitter or multiple emitters, preferably formed as diode laser bars, of the type discussed are formed as edge emitters. The diode laser device 3 is in particular configured to emit a laser beam substantially in the direction of an arrow 5 pointing—from a viewer's perspective—to the left. Here, the diode laser device 3 is, by way of example, of plate-like form.

The diode laser arrangement 1 furthermore has at least one cooling device 7. In the exemplary embodiment as per FIG. 1, exactly one such cooling device 7 is provided. The at least one cooling device 7 is arranged on the diode laser device 3. Here, the cooling device 7 lies against the diode laser device 3. In the exemplary embodiment as per FIG. 1, the cooling device 7, in particular a support surface 9, on which the diode laser device 3 lies at least in certain regions, of the cooling device 7, extends—from the viewer's perspective—beyond a right-hand end 10 of the diode laser device 3.

The at least one cooling device 7 is configured to cool the diode laser device 3. In the exemplary embodiment as per FIG. 1, heat is transferred in particular between the diode laser device 3 and the cooling device 7 at least over sections of the support surface 9.

The at least one cooling device 7 has a contact body 11 and at least one heat-conducting insert 13. In the exemplary embodiment as per FIG. 1, exactly one heat-conducting insert 13 is provided, which is for example of plate-like form. In particular, the heat-conducting insert 13 is arranged substantially parallel to the diode laser device 3 and to the support surface 9. The contact body 11 has a first material or is composed of a first material. The at least one heat-conducting insert 13 has a second material which differs from the first material, or is composed of a second material which differs from the first material.

The contact body 11 is arranged on the diode laser device 3. In the exemplary embodiment as per FIG. 1, the diode laser device 3 lies against the contact body 11 in a region of the support surface 9. The support surface 9 is planar here, such that it is made possible for the diode laser device 3 to lie against the support body 11 in a substantially gap-free manner. In particular, the support surface 9 extends—from the viewer's perspective—in a direction into the image plane and out of the image plane to such an extent that the diode laser device 3 lies with a first side 14 entirely on said support surface. In this way, particularly effective heat transfer between the diode laser device 3 and the cooling device 7 is realized.

The at least one heat-conducting insert 13 is embedded in the contact body 11. In the exemplary embodiment as per FIG. 1, the heat-conducting insert 13 is arranged in an interior of the contact body 11. In particular, here, at an end of the heat-conducting insert 13 which is situated—from the viewer's perspective—below the image plane and at an end of the heat-conducting insert 13 which is situated above the image plane, the heat-conducting insert 13 is surrounded by the contact body 11, such that substantially complete enclosure of the heat-conducting insert 13 by the contact body 11 is realized.

Here, the contact body 11 forms a closed shell around the heat-conducting insert 13. A material thickness of the contact body 11 in the region of the support surface 9, in FIG. 1 an extent of that section of the contact body 11 which lies between the heat-conducting insert 13 and the support surface 9, may be constant or may vary. In FIG. 1, the material thickness is, by way of example, formed so as to be constant in said region. In particular, a material thickness of the type discussed is dimensioned, prior to assembly of the diode laser device 3, such that mechanical processing, in particular machining with a geometrically defined and/or geometrically undefined cutting edge, is possible in order to produce the support surface 9 at least in certain sections with the geometrical characteristics required for the assembly of the diode laser device 3, for example a planarity.

Optionally, the first material has a first thermal conductivity, wherein the second material has a second thermal conductivity which is greater than the first thermal conductivity. The first material is in particular copper or a copper alloy. The second material is in particular selected from a group comprising a copper-diamond composite material, a silver-diamond composite material and a carbon composite material.

In particular, a coefficient of thermal expansion of the at least one cooling device 7 is coordinated with a coefficient of thermal expansion of the diode laser device 3 such that distortion of the diode laser device 3, in particular of one or more emitters of the diode laser device 3, is avoided.

Optionally, the at least one heat-conducting insert 13 is produced by means of sintering.

Optionally, the at least one heat-conducting insert 13 is connected to the contact body 11 by means of sintering. In particular, the contact body 11 is produced by means of sintering.

In particular, a connection between the contact body 11 and the at least one heat-conducting insert 13 does not have a soldered connection. In particular, here, no soft solders or hard solders are provided for the connection of the contact body 11 and the at least one heat-conducting insert 13.

Figure 3:
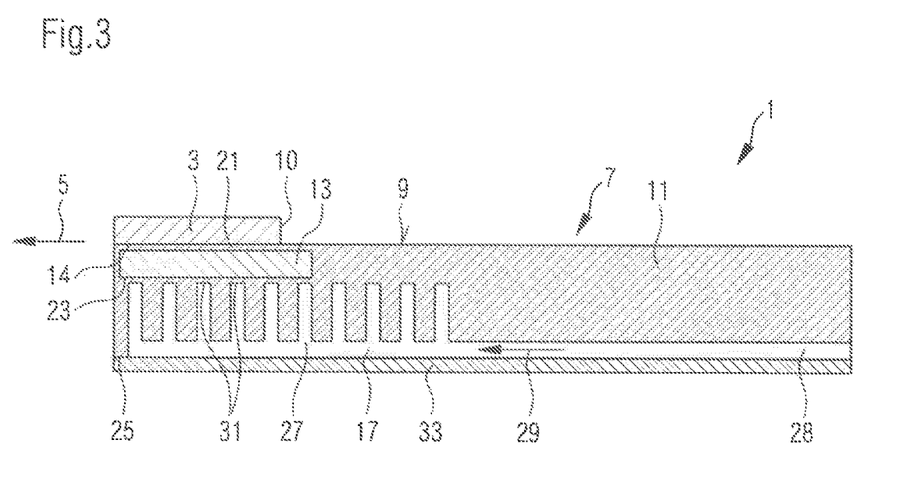
FIG. 3 is a schematic illustration of a third exemplary embodiment of a diode laser arrangement with exactly one cooling device in longitudinal section.

Optionally, the contact body 11 has cooling structures for conducting a cooling fluid, this not being provided in the exemplary embodiment as per FIG. 1. Corresponding cooling structures are illustrated in FIG. 3. As per FIG. 1, the contact body 11 and the heat-conducting insert 13 form, by way of example, a submount, which in particular promotes the heat dissipation.

Optionally, the at least one cooling device 7—as illustrated in FIG. 1—has a separate cooling element 15, which is thermally coupled to the contact body 11 and/or to the at least one heat-conducting insert 13. Here, the separate cooling element 15 is in particular formed so as to be geometrically delimitable, in particular in relation to the contact body 11 and the at least one heat-conducting insert 13. As per FIG. 1, the separate cooling element 15 lies against the contact body 11 at a connection surface 16, situated opposite the support surface 9, of the contact body 11, wherein a thermal coupling to the contact body 11 and to the heat-conducting insert 13 is realized. Heat losses from the diode laser device 3 are thus absorbed via the contact body 11 and the heat-conducting insert 13 and released to the separate cooling element 15. Owing to the good mechanical machinability of the first material, the connection surface 16 can be adapted, with regard to its surface and/or structure, to the separate cooling element 15 such that a thermal resistance during the heat transfer between the contact body 11 and the separate cooling element 15 is as low as possible.

The contact body 11 preferably has, at least in a region adjoining the diode laser device 3, along part of the support surface 9, a material thickness which is preferably at least 5 µm and at most 100 µm, preferably at least 10 µm and at most 50 µm. The contact body 11 preferably has, at least in a region adjoining the separate cooling element 15, along the connection surface 16, a material thickness which is preferably at least 5 µm and at most 100 µm, preferably at least 10 µm and at most 50 µm. Such material thicknesses ensure effective heat transfer between the diode laser device 3 and the heat-conducting insert 13 and between the heat-conducting insert 13 and the separate cooling element 15.

In the exemplary embodiment as per FIG. 1, it becomes clear that heat losses introduced in particular locally by the diode laser device 3 via the support surface 9 into the contact body 11 with the heat-conducting insert 13 can be released by means of the heat-conducting insert 13, preferably in a manner distributed uniformly over the connection surface 16, to the separate cooling element 15. The contact body 11 with the heat-conducting insert 13 functions here in particular as a heat spreader, whereby the effectiveness of the heat dissipation is increased. The contact body 11 with the heat-conducting insert 13 may—from the viewer's perspective—also extend further to the right than is illustrated in FIG. 1, for example to the same extent as the cooling element 15.

Optionally, the separate cooling element 15 can be cooled by means of a cooling fluid. In the exemplary embodiment as per FIG. 1, a cooling circuit 17 carrying such a cooling fluid is schematically illustrated.

The contact body 11 and/or the at least one heat-conducting insert 13 are/is connected to the separate cooling element 15 in particular by means of sintering or soldering.

Figure 2:
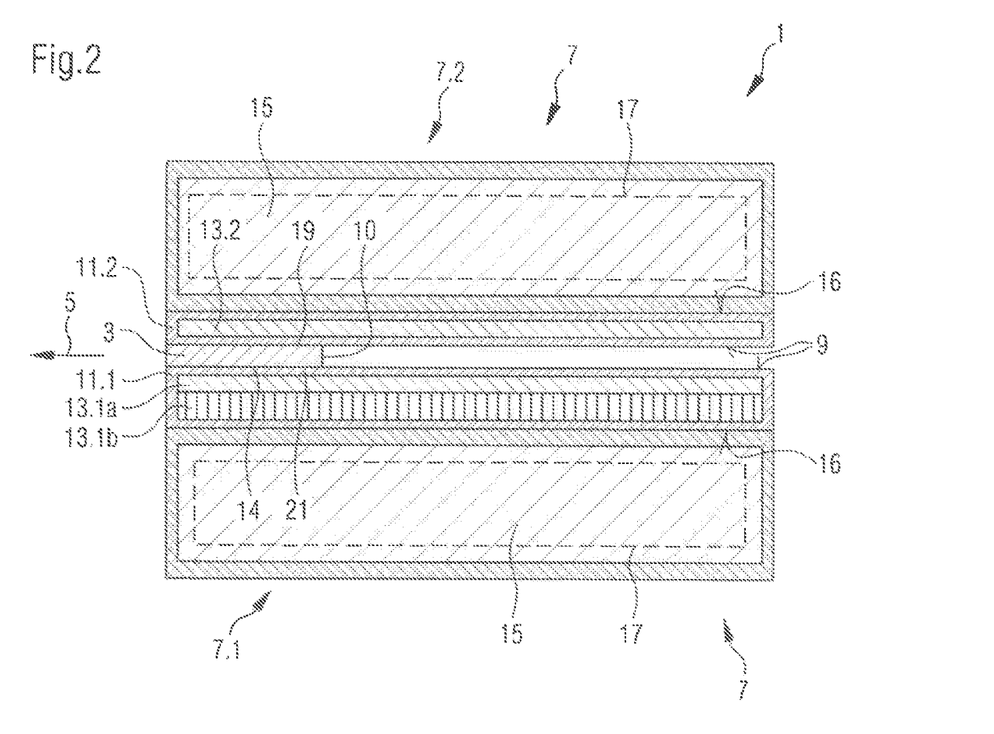
FIG. 2 is a schematic illustration of a second exemplary embodiment of a diode laser arrangement with two cooling devices in longitudinal section.

FIG. 2 illustrates a second exemplary embodiment of the diode laser arrangement 1 schematically in longitudinal section. Identical and functionally identical elements are denoted by the same reference designations, such that, in this regard, reference is made to the description above. Here, the diode laser arrangement 1 has two cooling devices 7 of the type discussed. Here, a first cooling device 7.1 of the two cooling devices 7 is arranged on the first side 14 of the diode laser device 3, which is by way of example of plate-like form. A second cooling device 7.2 of the two cooling devices 7 is arranged on a second side 19, situated opposite the first side 14, of the diode laser device 3.

Here, the first cooling device 7.1 has a first contact body 11.1 of the type discussed. Furthermore, the first cooling device 7.1 has a first heat-conducting insert 13.1a of the type discussed and a second heat-conducting insert 13.1b of the type discussed, which are in each case embedded in the first contact body 11.1. The first contact body 11.1 with the first heat-conducting insert 13.1a and the second heat-conducting insert 13.1b extends significantly further beyond the right-hand end 10 of the diode laser device 3 than the contact body 11 with the heat-conducting insert 13 in the exemplary embodiment as per FIG. 1. For example, the first heat-conducting insert 13.1a may have a copper-diamond composite material or a silver-diamond composite material, wherein the second heat-conducting insert 13.1b has a carbon composite material.

The first heat-conducting insert 13.1a and the second heat-conducting insert 13.1b of the first cooling device 7.1 are in each case of plate-like form and arranged substantially parallel to the support surface 9 of the first cooling device 7.1 and to the diode laser device 3. Here, the first heat-conducting insert 13.1a of the first cooling device 7.1 is—spaced apart by means of a section 21 of the first contact body 11.1—arranged directly adjacent to the diode laser device 3, wherein the second heat-conducting insert 13.1b of the first cooling device 7.1 is arranged between the first heat-conducting insert 13.1a and a first separate cooling element 15, of the type already discussed, of the first cooling device 7.1. In the exemplary embodiment as per FIG. 2, the first heat-conducting insert 13.1a and the second heat-conducting insert 13.1b lie against one another.

Preferably, the material thickness of the first contact body 11.1 is, at least in a region adjoining the diode laser device 3, along part of the support surface 9, in particular in the section 21, at least 5 µm and at most 100 µm, preferably at least 10 µm and at most 50 µm. At least in a region adjoining the first separate cooling element 15, along the connection surface 16, the material thickness of the first contact body 11.1 is preferably at least 5 µm and at most 100 µm, preferably at least 10 µm and at most 50 µm.

The second cooling device 7.2 has a second contact body 11.2 and a heat-conducting insert 13.2 which is embedded in the second contact body 11.2. Here, the second cooling device 7.2 extends to the same extent beyond the right-hand end 10 of the diode laser device 3 as the first cooling device 7.1. Furthermore, the second cooling device 7.2 has a second separate cooling element 15 of the type already discussed.

Here, the heat-conducting insert 13.2 of the second cooling device 7.2 is of plate-like form and is arranged substantially parallel to the support surface 9 of the second cooling device 7.2 and to the diode laser device 3.

Preferably, the material thickness of the second contact body 11.2 is, at least in a region adjoining the diode laser device 3, along part of the support surface 9, at least 5 µm and at most 100 µm, preferably at least 10 µm and at most 50 µm. Preferably, the material thickness of the second contact body 11.2 is, at least in a region adjoining the second separate cooling element 15, along the connection surface 16, at least 5 µm and at most 100 µm, preferably at least 10 µm and at most 50 µm.

In the exemplary embodiment as per FIG. 2, it becomes clear that heat losses introduced in particular locally by the diode laser device 3 via the support surfaces 9 into the first contact body 11.1 and the second contact body 11.2 with the heat-conducting inserts 13.1a, 13.1b, 13.2 can be released by means of the heat-conducting inserts 13.1a, 13.1b, 13.2, preferably in a manner distributed uniformly over the connection surfaces 16, to the separate cooling elements 15. In comparison with the exemplary embodiment as per FIG. 1, it is the case in FIG. 2 that the ratio between the connection surface 16 and a region of the support surface 9 into which heat losses are introduced is significantly increased. In this way, particularly effective heat spreading is realized, whereby the effectiveness of the heat dissipation is further increased.

It is optionally provided that the diode laser device 3 is supplied with electrical current via the first cooling device 7.1 and the second cooling device 7.2, wherein, in particular, an electrical connection of the diode laser device 3 is realized via the support surfaces 9 respectively assigned to the first cooling device 7.1 and to the second cooling device 7.2.

A method for producing a diode laser arrangement 1, in particular the diode laser arrangement 1 according to the exemplary embodiments described above, will be described below. In the context of the method, at least one cooling device 7, 7.1, 7.2 configured for cooling a diode laser device 3 is arranged on the diode laser device 3. A contact body 11, 11.1, 11.2 of the at least one cooling device 7, 7.1, 7.2 is arranged on the diode laser device 3. Furthermore, at least one heat-conducting insert 13, 13.1a, 13.1b, 13.2 of the at least one cooling device 7, 7.1, 7.2 is embedded in the contact body 11, 11.1, 11.2.

FIG. 3 illustrates a third exemplary embodiment of the diode laser arrangement 1. Identical and functionally identical elements are denoted by the same reference designations, such that, in this regard, reference is made to the description above. In this exemplary embodiment, the diode laser arrangement 1 has exactly one cooling device 7, which is arranged on the first side 14 of the diode laser device 3. The cooling device 7 has the contact body 11 and the heat-conducting insert 13. A spatial extent of the heat-conducting insert 13—from the viewer's perspective—to the right is selected here by way of example. Alternatively, the heat-conducting insert 13 may extend further in the direction of an outermost right-hand end of the contact body 11.

The material thickness of the contact body 11 is relatively small in the section 21 in which the diode laser device 3 is arranged, via the support surface 9, on the contact body 11. The material thickness in the section 21 is preferably at least 5 μm and at most 100 μm, preferably at least 10 μm and at most 50 μm.

On a side of the contact body 11 which is situated opposite the support surface 9, the contact body 11 has a greater material thickness. In particular, said material thickness is optionally at least 1 mm, optionally at least 3 mm, or optionally at least 5 mm, between a bottom side 23 of the heat-conducting insert 13 and a base region 25 of the contact body 11.

In the region between the bottom side 23 of the heat-conducting insert 13 and the base region 25 of the contact body 11, the contact body 11 has cooling structures 27 for conducting a cooling fluid, which cooling structures are in particular part of a cooling circuit 17. The cooling structures 27 can be easily formed into the contact body 11 by means of mechanical processing owing to the material thickness provided in said region. The cooling structures 27 have a multiplicity of cooling channels which guide the cooling fluid along close to the heat-conducting insert 13, such that effective heat transfer can be realized there. By way of example, here, the cooling fluid is guided via an inlet 28 of the cooling device 7 in the direction of an arrow 29 through the cooling structures 27 into the vicinity of the heat-conducting insert 13, where said cooling fluid can absorb heat. The cooling fluid can be conducted away from the vicinity of the heat-conducting insert 13 again via cooling structures 27 which are not illustrated in FIG. 3.

In order to allow particularly effective heat transfer between the heat-conducting insert 13 and the cooling structures 27, or the cooling fluid guided therein, in the vicinity of the heat-conducting insert 13, the material thickness of the contact body 11 in a region between the bottom side 23 of the heat-conducting insert 13 and a heat absorption section 31 of the cooling structures 27 is formed so as to be relatively small, wherein the material thickness is preferably at least 5 μm and at most 100 μm, preferably at least 10 μm and at most 50 μm. In the exemplary embodiment as per FIG. 3, the cooling structures 27 have multiple heat absorption sections 31.

Optionally, at least one constituent part of the at least one cooling device 7, in this case the exactly one cooling device 7, is produced by means of an additive manufacturing process. It is possible for the contact body 11 to be produced by means of an additive manufacturing process in combination with another manufacturing process, for example sintering. In particular, at least a section of the contact body 11 which has the cooling structures 27 may be realized by means of an additive manufacturing process. It is however also possible for the contact body 11 to be manufactured entirely by means of an additive manufacturing process.

The contact body 11 has a cover plate 33 which seals off the cooling structures 27 in the base region 25 of the contact body 11 with respect to surroundings of the diode laser arrangement 1. The cover plate 33 is fixedly assembled with a part of the contact body 11 which—from the viewer's perspective—is situated above the cover plate 33. Alternatively, it is optionally provided that the cover plate 33 is formed as a single piece with that part of the contact body 11 which is situated above the cover plate 33, wherein the contact body 11 with the cooling structures 27 is produced in particular by means of an additive manufacturing process.

Owing to the cooling structures 27 provided in the contact body 11, it is possible for a separate cooling element 15 of the type described above, which is in particular spatially separable from the contact body 11, to be omitted in the case of the exemplary embodiment of the diode laser arrangement 1 as per FIG. 3.

Overall, it can be seen that, by means of the diode laser arrangement 1 and the method for producing a diode laser arrangement 1, cooling of the diode laser device 3 can be improved, and production costs can be reduced.

The invention claimed is:

1. A diode laser configuration, comprising:
a diode laser device; and
at least one cooling device disposed on said diode laser device, wherein said at least one cooling device being configured to cool said diode laser device, wherein said at least one cooling device having a contact body and at least one heat-conducting insert, wherein said contact body having a first material or is composed of a first material, wherein said at least one heat-conducting insert having a second material differing from the first material, or is composed of said second material differing from the first material, wherein said contact body being disposed on said diode laser device, wherein said at least one heat-conducting insert is embedded in said contact body, wherein said at least one cooling device has a connection between said contact body and said at least one heat-conducting insert which has no soldered connection.

2. The diode laser configuration according to claim 1, wherein:
said first material has a first thermal conductivity; and
said second material has a second thermal conductivity which is greater than the first thermal conductivity.

3. The diode laser configuration according to claim 1, wherein said first material is copper or a copper alloy.

4. The diode laser configuration according to claim 1, wherein a coefficient of thermal expansion of said at least one cooling device is coordinated with a coefficient of thermal expansion of said diode laser device such that tension of said diode laser device is avoided.

5. The diode laser configuration according to claim 1, wherein said contact body has cooling structures for conducting a cooling fluid.

6. The diode laser configuration according to claim 1, wherein said at least one cooling device has a separate cooling element which is thermally coupled to said contact body and/or to said at least one heat-conducting insert.

7. The diode laser configuration according to claim 6, wherein said separate cooling element can be cooled by means of a cooling fluid.

8. The diode laser configuration according to claim 1, wherein at least one constituent part of said at least one cooling device is produced by means of an additive manufacturing process.

9. The diode laser configuration according to claim 1, wherein said at least one cooling device is one of two cooling devices, wherein a first cooling device of said two cooling devices is disposed on a first side of said diode laser device, and wherein a second cooling device of said two cooling devices is disposed on a second side, situated opposite said first side, of said diode laser device.

10. A diode laser configuration, comprising:
a diode laser device; and
at least one cooling device disposed on said diode laser device, wherein said at least one cooling device being configured to cool said diode laser device, wherein said at least one cooling device having a contact body and at least one heat-conducting insert, wherein said contact body having a first material or is composed of a first material, wherein said at least one heat-conducting insert having a second material differing from the first material, or is composed of said second material differing from the first material, wherein said contact body being disposed on said diode laser device, and wherein said at least one heat-conducting insert is embedded in said contact body, wherein said second material is selected from the group consisting of: a copper-diamond composite material, a silver-diamond composite material and a carbon composite material.

11. A diode laser configuration, comprising:
a diode laser device; and
at least one cooling device disposed on said diode laser device, wherein said at least one cooling device being configured to cool said diode laser device, wherein said at least one cooling device having a contact body and at least one heat-conducting insert, wherein said contact body having a first material or is composed of a first material, wherein said at least one heat-conducting insert having a second material differing from the first material, or is composed of said second material differing from the first material, wherein said contact body being disposed on said diode laser device, and wherein said at least one heat-conducting insert is embedded in said contact body, wherein said at least one heat-conducting insert is produced by means of sintering.

12. A diode laser configuration, comprising:
a diode laser device; and
at least one cooling device disposed on said diode laser device, wherein said at least one cooling device being configured to cool said diode laser device, wherein said at least one cooling device having a contact body and at least one heat-conducting insert, wherein said contact body having a first material or is composed of a first material, wherein said at least one heat-conducting insert having a second material differing from the first material, or is composed of said second material differing from the first material, wherein said contact body being disposed on said diode laser device, and wherein said at least one heat-conducting insert is embedded in said contact body, wherein said at least one heat-conducting insert is connected to said contact body by means of sintering.

13. A diode laser configuration, comprising:
a diode laser device; and
at least one cooling device disposed on said diode laser device, wherein said at least one cooling device being configured to cool said diode laser device, wherein said at least one cooling device having a contact body and at least one heat-conducting insert, wherein said contact body having a first material or is composed of a first material, wherein said at least one heat-conducting insert having a second material differing from the first material, or is composed of said second material differing from the first material, wherein said contact body being disposed on said diode laser device, wherein said at least one heat-conducting insert is embedded in said contact body, wherein said at least one cooling device has a separate cooling element which is thermally coupled to said contact body and/or to said at least one heat-conducting insert, and wherein said contact body and/or said at least one heat-conducting insert are/is connected to said separate cooling element by means of sintering or soldering.

14. A method for producing a diode laser configuration, which comprises the steps of:
providing a diode laser device;
providing at least one cooling device configured for cooling the diode laser device and disposed on the diode laser device;
arranging a contact body of the at least one cooling device on the diode laser device;
embedding at least one heat-conducting insert of the at least one cooling device in the contact body; and
forming a connection between the contact body and the at least one heat-conducting insert that has no soldered connection.

* * * * *